(12) United States Patent
Raith et al.

(10) Patent No.: US 12,040,522 B2
(45) Date of Patent: Jul. 16, 2024

(54) OVER-THE-AIR MEASUREMENT SYSTEM

(71) Applicant: Rohde & Schwarz GmbH & Co. KG, Munich (DE)

(72) Inventors: Andreas Raith, Munich (DE); Andreas Uhrmann, Munich (DE); Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 366 days.

(21) Appl. No.: 17/505,369

(22) Filed: Oct. 19, 2021

(65) Prior Publication Data

US 2023/0123894 A1    Apr. 20, 2023

(51) Int. Cl.
*H01P 1/161* (2006.01)
*G01R 29/10* (2006.01)
*H01Q 19/17* (2006.01)

(52) U.S. Cl.
CPC ............ *H01P 1/161* (2013.01); *G01R 29/105* (2013.01); *H01Q 19/17* (2013.01)

(58) Field of Classification Search
CPC ... H01P 1/161; G01R 29/105; G01R 29/0864; G01R 29/0821; G01R 29/0871; G01R 29/10; G01R 29/087; H01Q 19/17; H01Q 25/001; H01Q 13/0258; H01Q 19/10; H01Q 19/19; H01Q 19/13; H01Q 19/12; H01Q 13/02; H01Q 25/007; H01Q 21/064; H01Q 3/02; H01Q 19/132; H01Q 21/08; H01Q 21/24; H01Q 13/0208; H01Q 19/08; H01Q 15/14; H01Q 3/08; H04B 17/102

See application file for complete search history.

(56) References Cited

U.S. PATENT DOCUMENTS

| 4,208,661 | A  | 6/1980 | Vokurka |
| 6,144,692 | A  | 11/2000 | Beck |
| 11,024,975 | B2 | 6/2021 | Rowell et al. |

(Continued)

FOREIGN PATENT DOCUMENTS

EP    3480884 A1    5/2019

OTHER PUBLICATIONS

Menargues, E. et al., "Compact Orthomode Transducer with Broadband Beamforming Capability," 2018 IEEE/MTT-S International Microwave Symposium, pp. 152-155.

*Primary Examiner* — John W Poos
(74) *Attorney, Agent, or Firm* — CHRISTENSEN O'CONNOR JOHNSON KINDNESS PLLC

(57) ABSTRACT

The present disclosure provides an over-the-air measurement system for testing a device under test. The over-the-air measurement system includes an orthomode transducer (OMT) assembly having several separately formed orthomode transducer components that form at least two orthomode transducers. The orthomode transducer assembly has at least two output interfaces for feed antennas. Each of the at least two output interfaces is connected with one dedicated orthomode transducer. Two input interfaces are associated with each of the orthomode transducers. Each of the input interfaces merge into a corresponding waveguide transition that ends up in the respective orthomode transducer that is associated with the corresponding input interface. The several orthomode transducer components are stacked together linearly.

17 Claims, 3 Drawing Sheets

(56) References Cited

U.S. PATENT DOCUMENTS

| | | | |
|---|---|---|---|
| 2006/0199543 A1* | 9/2006 | Spirtus | H04B 17/20 455/67.11 |
| 2015/0097747 A1* | 4/2015 | Hwang | H01Q 13/0258 343/785 |
| 2019/0302184 A1* | 10/2019 | Rowell | G01R 31/2813 |
| 2020/0021033 A1* | 1/2020 | Rowell | H01Q 13/0225 |
| 2020/0403319 A1 | 12/2020 | Rowell et al. | |
| 2021/0063480 A1 | 3/2021 | Toben-Heiken et al. | |
| 2021/0364565 A1* | 11/2021 | Maruo | H01Q 15/16 |

* cited by examiner

OVER-THE-AIR MEASUREMENT SYSTEM

FIELD OF THE DISCLOSURE

Embodiments of the present disclosure relate to an over-the-air measurement system for testing a device under test.

BACKGROUND

Modern communication systems comprise devices that communicate over-the-air (OTA). The respective devices are tested with regard to certain standards, for instance 3GPP, CTIA or FTC standards, in order to characterize the respective device. Modern communication standards ensure a wideband operation, which however makes it difficult to test the devices under test with respect to the entire frequency range. Typically, the testing takes place by a so-called compact antenna test range (CATR), which comprises at least one reflector and an antenna facing the respective reflector such that a beam path is established between the antenna and the device under test via the respective reflector. Hence, (indirect) far-field conditions can be provided since the traveling distance of the electromagnetic waves is increased by the reflector located in the beam path.

While the reflector has sufficient operational bandwidth for testing the wideband frequency range of the respective telecommunication standard, the constraint in the over-the-air measurement system is due to the antenna, namely the measurement antenna that is also called feed antenna. In some embodiments, the antenna must have characteristics such as a stable phase center, low side lobes and stable beamwidth in order to ensure proper testing of the device under test. However, these requirements concerning the characteristics of the antenna result in a narrow bandwidth antenna that cannot cover the entire bandwidth of the respective telecommunication standard used for testing the device under test.

Accordingly, it is known in the state of the art to use multiple antennas assigned to different frequency ranges, wherein the multiple antennas are mounted on an antenna positioner that moves each of the multiple antennas into the phase center of the over-the-air measurement system, resulting in optimal quiet zones subsequently. However, the additional antenna positioner increases the overall costs of the measurement system and makes the entire measurement system more complex.

As an alternative solution, it is also known in the state of the art to use offset feed antennas where a second feed antenna is offset from the focal point of the respective reflector, resulting in an angled wave front in the quiet zone. Hence, the respective quiet zone is shifted from the center (off-centered quiet zone), which is disadvantageous. For a measurement system having only a single reflector, an offset greater than 5 cm results in a shift of the quiet zone out of its center in the range of 30-100%. In order to compensate for this movement, it is known to move the device under test by a device under test positioner so that the device under test is re-positioned at the respective center of the offset antenna. Again, an additional positioner is required that makes the entire measurement system more cost-intensive and more complex.

Accordingly, there is need for cost-efficient over-the-air measurement system that ensures wideband testing of the device under test in a less-complex manner.

SUMMARY

Embodiments of the present disclosure provide an over-the-air measurement system for testing a device under test. In an embodiment, the over-the-air measurement system comprises and orthomode transducer (OMT) assembly having several separately formed orthomode transducer components that form at least two orthomode transducers. The orthomode transducer assembly has at least two output interfaces for feed antennas. Each of the at least two output interfaces is connected with one dedicated orthomode transducer. Two input interfaces are associated with each of the orthomode transducers. Each of the input interfaces merge into a corresponding waveguide transition that ends up in the respective orthomode transducer that is associated with the corresponding input interface. The several orthomode transducer components are stacked together linearly.

Further, embodiments of the present disclosure provide an over-the-air measurement system for testing a device under test. In an embodiment, the over-the-air measurement system comprises an orthomode transducer assembly having several separately formed orthomode transducer components that form at least two orthomode transducers. The orthomode transducer assembly has at least two output interfaces for feed antennas. Each of the at least to output interfaces is connected with one dedicated orthomode transducer. Two input interfaces are associated with each of the orthomode transducers. Each of the input interfaces merge into a corresponding waveguide transition that ends up in the respective orthomode transducer that is associated with the corresponding input interface. The at least two output interfaces are located at a common side surface of the orthomode transducer assembly, wherein the common side surface is planar.

Moreover, embodiments of the present disclosure provide an over-the-air measurement system for testing a device under test. In an embodiment, the over-the-air measurement system comprises an orthomode transducer assembly having several separately formed orthomode transducer components that form at least two orthomode transducers. The orthomode transducer assembly has at least two output interfaces for feed antennas. Each of the least two output interfaces is connected with one dedicated orthomode transducer. Two input interfaces are associated with each of the orthomode transducers. Each of the input interfaces merge into a corresponding waveguide transition that ends up in the respective orthomode transducers that is associated with the corresponding input interface. The at least two output interfaces are arranged with respect to each other such that an antenna phase center separation is below 2 centimeters.

Accordingly, an orthomode transducer assembly is provided, which has the features mentioned above, which relate to the structure and/or characteristics of the orthomode transducer assembly.

The orthomode transducer assembly provides a special offset antenna arrangement such that the quiet zone offset is minimized due to the specific design of the orthomode transducer assembly, for example the separately formed orthomode transducer components that are placed on each other and connected with each other in order to establish the orthomode transducer assembly in its assembled state. The multiple orthomode transducer components may be stacked together linearly, which means that the several separately formed orthomode transducer components are sandwiched, as the respective orthomode transducer components each are assigned to a respective layer of the orthomode transducer assembly.

The respective design of the orthomode transducer assembly ensures that the antenna phase center separation of at least two feed antennas connected with the respective output interface of the orthomode transducer assembly is below 2 cm, for example below 1.8 cm. Accordingly, a wideband testing of the device under test is possible without using a mechanical feed switcher, e.g., antenna positioner, or rather without re-positioning the device under test by a positioner for the device under test, thereby reducing the overall costs and complexity of the entire over-the-air measurement system.

The respective positioner(s) can be omitted due to the fact that the orthomode transducer assembly is construed such that the output interfaces of the orthomode transducer assembly are located at a common side surface that is planar such that the feed antennas connected with the output interfaces are facing into the same direction. In other words, the feed antennas located at the planar common side surface are located in a common plane. Furthermore, the respective output interfaces are closely located, thereby ensuring that the feed antennas are located close to each other at the respective common side surface. Hence, the antenna phase center separation is reduced significantly such that a shift of the quiet zone when changing the respective feed antenna for testing is minimized, e.g., below 2 cm, for example below 1.8 cm.

In general, the two input interfaces are associated with each of the orthomode transducers are used for forwarding horizontally polarized signals and vertically polarized signals to the dedicated orthomode transducers respectively, which combines both differently polarized signals. The combined signal(s) can be forwarded to the corresponding output interface for emission.

An aspect provides that the several orthomode transducer components are orientated with respect to each other such that two straight waveguide transitions are provided which both end up in the same orthomode transducer. Hence, at least one of the several orthomode transducers interact with two straight waveguide transitions used for providing the differently polarized signals.

Another aspect provides that the several orthomode transducer components are orientated with respect to each other such that one straight waveguide transition and an angled waveguide transition are provided which both end up in the same orthomode transducer. Accordingly, one of the several orthomode transducers, for example another one than the one interacting with two straight waveguide transitions, interacts with an angled waveguide transition and a straight waveguide transition. Again, both waveguide transitions are used for forwarding horizontally polarized signals and vertically polarized signals to the respective orthomode transducer.

For instance, the angled waveguide transition comprises a section having a ninety degree (90°) angle. Accordingly, a compact and efficient waveguide transition is provided. In some embodiments, the angled waveguide transition ensures that several orthomode transducers can be supplied with differently polarized signals while still providing a compact orthomode transducer assembly that has a minimized antenna phase center separation.

According to a further aspect, neighbored orthomode transducer components face each other via corresponding contact sides. The corresponding contact sides of the neighbored orthomode transducer component have structured sections that together form one of the at least orthomode transducers. Hence, the orthomode transducers of the orthomode transducer assembly, for example each one, are established by two separately formed orthomode transducer components that contact each other via the respective contact sides in the assembled state. In the assembled state, the contact sides face each other wherein the respective structured sections of the contact sides are located directly opposite of each other, thereby forming the orthomode transducer. Accordingly, the orthomode transducers are provided by corresponding structured sections opposing each other in the assembled state of the orthomode transducer assembly.

Moreover, the orthomode transducer assembly may comprise 2×N−(N−1) separately formed orthomode transducer components, wherein N corresponds to the number of orthomode transducers. This specific design of the orthomode transducer assembly ensures that the number of orthomode transducer components can be reduced significantly compared to orthomode transducer assemblies known in the state of the art, as at least one of the several orthomode transducer components, for example a center or middle orthomode transducer component, partially establishes two orthomode transducers simultaneously. In some embodiments, the center or middle orthomode transducer component, namely the one having two adjacent orthomode transducer components (on opposite sides), has structured sections on opposite sides, which interact with corresponding structured sections of the adjacent orthomode transducer components located at the respective contact sides. In other words, the center or middle orthomode transducer component is sandwiched by two adjacently located orthomode transducer components at opposite sides.

The over-the-air measurement system further comprises two feed antennas that are connected with the at least two output interfaces of the orthomode transducer assembly, respectively. The respective feed antennas may be established as horn antennas that are connected with the output interfaces in order to receive the signals provided by the respective orthomode transducers, e.g., the combined signals.

Moreover, at least two waveguides may be provided that are connected with the at least two input interfaces of the orthomode transducer assembly respectively. The waveguides are used for forwarding the respectively polarized signals to the orthomode transducer assembly, e.g. from a signal generator of the measurement system.

The signal generator may be part of measurement equipment.

The over-the-air measurement system may comprise at least one reflector. Hence, the over-the-air measurement system may relate to a single reflector system. The reflector is used for providing (indirect) far-field conditions, as the reflector is located in the beam path established between the feed antenna(s) connected to the orthomode transducer assembly and a testing location at which the device under test is located. For instance, the at least one reflector is a paraboloid reflector or a non-paraboloid reflector.

However, the over-the-air measurement system may also comprise more than one reflector, thereby establishing a multiple reflector system. The multiple reflectors may be located in the same beam path. Alternatively, the reflectors may be assigned to different feed antennas such that they are located in different beam paths, which are established between the individual antennas and the test location.

The orthomode transducer assembly may be orientated with respect to the at least one reflector such that at least two feed antennas connected with the orthomode transducer assembly are directed towards the at least one reflector. Due to the minimized antenna phase center separation and the fact that the output interfaces are located at the same planar side surface of the orthomode transducer assembly, the respective feed antennas may be directed towards the (same) reflector simultaneously. Hence, no feed switcher is necessary, as the different feed antennas are enabled to emit/ receive electromagnetic signals that are reflected via the (same) reflector accordingly.

Another aspect provides that the over-the-air measurement system comprises at least two reflectors, wherein the first reflector of the at least two reflectors is a main reflector established as a paraboloid reflector, and wherein the second reflector of the at least two reflectors is a sub-reflector established as non-paraboloid reflector. Accordingly, a multiple reflector system is provided wherein the respective reflectors are used to establish indirect far-field (IFF) conditions that are used to test the device under test under real conditions, namely far-field conditions.

Another aspect provides that the over-the-air measurement system comprises an RF-shielded chamber that accommodates the orthomode transducer assembly. Interfering and disturbing signals can be shielded appropriately by the RF-shielded chamber, thereby improving the testing accordingly.

In addition, the over-the-air measurement system may comprise a measurement equipment that is connected with the orthomode transducer assembly. The measurement equipment may provide the respective differently polarized signals forwarded to the orthomode transducer assembly, for example its input interfaces. Thus, the measurement equipment may comprise a signal generator, wherein the measurement equipment is connected with respective waveguides that are connected with the input interfaces such that the signals generated are forwarded to the orthomode transducer assembly, namely the differently polarized signals.

Furthermore, analysis equipment may be provided that is connected with the orthomode transducer assembly and/or the device under test in order to receive signals to be analyzed to characterize the behavior of the device under test during the testing.

In addition, the over-the-air measurement system may comprise a positioner system for the device under test. The positioner system may be used for rotating the device under test during the testing in order to characterize the device under test sufficiently, for example in several directions. In some embodiments, the positioner system may be a three-dimensional (3D) positioner system, for instance a phone positioner and a tablet positioner in case of testing a mobile phone or rather a tablet.

In general, the positioner system ensures highly accurate azimuth and elevation positioning of the device under test, for example within the quiet zone(s).

In some embodiments, total radiated power (TRP) measurements can be performed accurately and fast.

According to an embodiment, the orthomode transducer assembly comprises three orthomode transducers. Hence, three output interfaces are provided that are connected with the orthomode transducers respectively. Further, respective feed antennas are connected with the orthomode transducers via the respective output interfaces. Therefore, three different frequency bands can be tested by the orthomode transducer assembly, thereby ensuring wideband testing of the device under test.

In some embodiments, a first of the three orthomode transducers is assigned to a frequency range of 24-42 GHz. A second of the three orthomode transducers is assigned to a frequency range of 35-60 GHz. A third of the three orthomode transducers is assigned to a frequency range of 60-90 GHz. The respective orthomode transducers are connected via the output interfaces with dedicated feed antennas that can be operated at the respective frequency ranges mentioned above. Therefore, three different frequency bands can be tested simultaneously by the orthomode transducer assembly without the need of re-positioning the device under test or rather the feed antennas, thereby improving the overall setup significantly.

As shown above, the different frequency bands associated with the three different orthomode transducers at least partially overlap, thereby ensuring broadband testing characteristics of the orthomode transducer assembly. In some embodiments, a frequency range from 24 GHz up to 90 GHz is covered by the orthomode transducer assembly.

In general, a compact multi-band orthomode transducer assembly is provided that has two or more orthomode transducers, for instance three orthomode transducers. The input interfaces associated with one orthomode transducer provide differently polarized signals, e.g. orthogonal polarized signals like horizontally polarized signals and vertically polarized signals. Each orthomode transducer of the multi-band orthomode transducer assembly may split a respective signal received via the output interface into two components that are polarized orthogonally with respect to each other, wherein the components are forwarded to the input interfaces. Further, each orthomode transducer is also configured to combine orthogonally polarized signals received via the input interfaces to a combined signal that is forwarded to the output interface.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
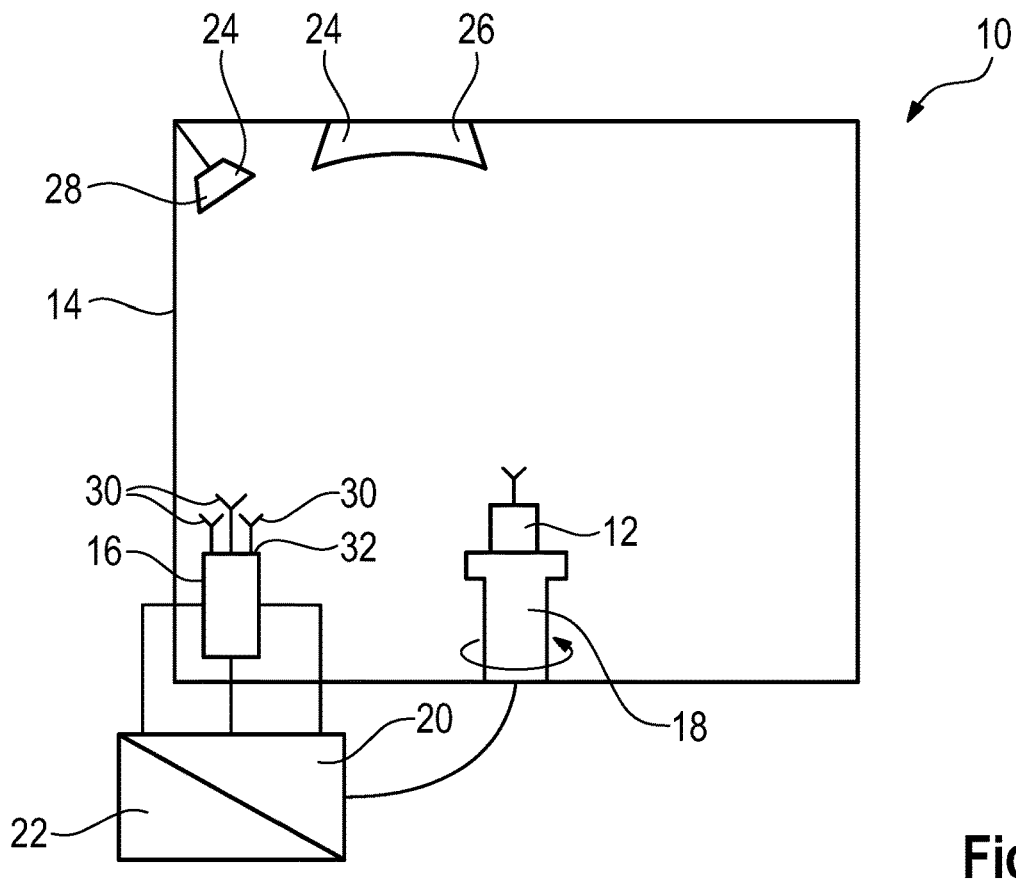
FIG. 1 schematically shows an overview of an over-the-air measurement system according to an embodiment of the present disclosure.

FIG. 1 shows an over-the-air measurement system 10 that is used for testing a device under test 12. The over-the-air measurement system 10 comprises an anechoic or RF shielded chamber 14 that accommodates the device under test 12 as well as an orthomode transducer (OMT) assembly 16 that is used for testing the device under test 12 as will be described hereinafter in more detail.

The over-the-air measurement system 10 further comprises a positioner system 18 for the device under test 12. In an embodiment, the positioner system 18 may be configured to rotate the device under test 12 at least along one rotational axis during the testing, for example in a three-dimensional manner, namely along at least two rotational axes. In one embodiment, the positioner system 18 includes one or more rotational stages, and in other embodiments, includes two or more rotational stages. The device under test 12 is mounted on the positioner system 18.

The over-the-air measurement system 10 may also comprise measurement equipment 20 as well as analysis equipment 22, which are connected with the orthomode transducer assembly 16 and/or the positioner system 18 in a suitable manner. Signals received by the device under test 12 may be forwarded to the analysis equipment 22 such that a respective communication connection is also established between the device under test 12 and the analysis equipment 22. Moreover, the measurement equipment 20 may be connected to the device under test 12. In some embodiments, the measurement equipment 20 and/or the analysis equipment 22 include circuitry configured to, for example, measure and/or analyze signals, data, etc.

The respective connections between the measurement equipment 20 and the orthomode transducer assembly 16 may be established, for example, by waveguides that forward differently polarized signals to the orthomode transducer assembly 16.

In the embodiment shown in FIG. 1, the over-the-air measurement system 10 may optionally comprise two reflectors 24, namely a main reflector 26 as well as a sub-reflector 28. Depending on the test scenario, the orthomode transducer assembly 16 may be orientated towards the main reflector 26 or the sub-reflector 28. In the shown embodiment, the main reflector 26 is established as a paraboloid reflector, whereas the sub-reflector 28 is established as a non-paraboloid reflector.

The reflector(s) 24 may be orientated towards the device under test 12, for example a test location at which the device under test 12 is positioned for testing purposes. Hence, beam paths are established between the orthomode transducer assembly 16 and the device under test 12 via the respective reflector(s) 24.

In the shown embodiment, the orthomode transducer assembly 16 is connected with feed antennas 30 that are differently sized and/or shaped in order to be used for different frequency bands as will be discussed later in more detail.

Figure 2:
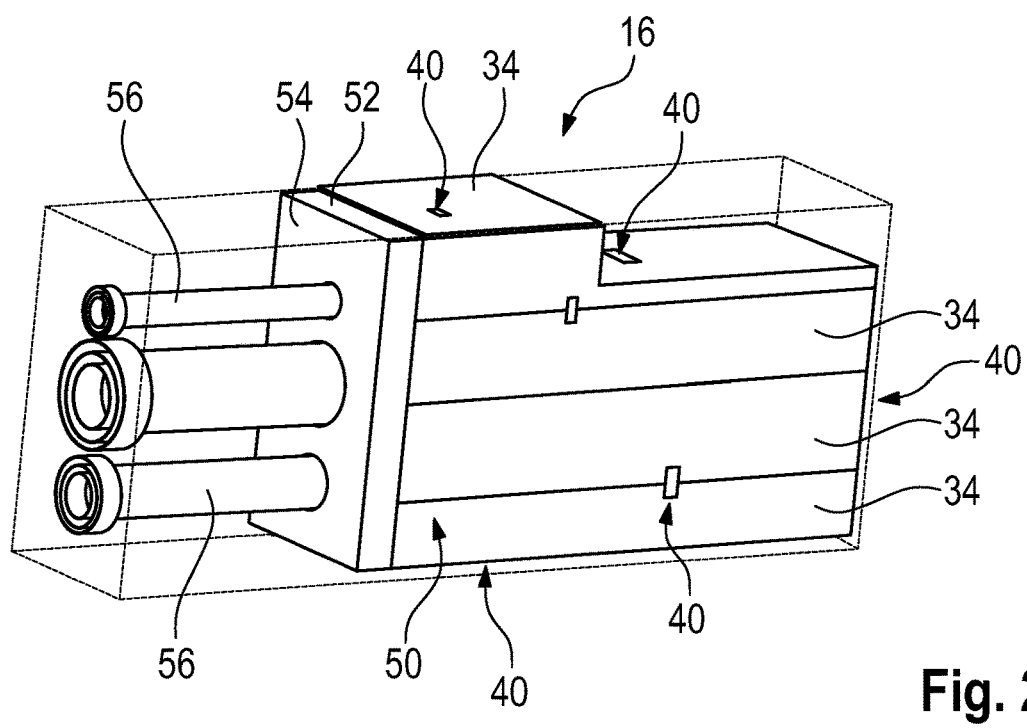
FIG. 2 shows an isometric view on an orthomode transducer assembly used in the over-the-air measurement system of FIG. 1.

FIG. 1 shows that the feed antennas 30 are connected to a common side surface 32 of the orthomode transducer assembly 16, which is shown in FIG. 2 in more detail as will be described below. Accordingly, the feed antennas 30 are directed towards the respective reflector(s) 24. In general, this arrangement ensures that wideband over-the-air (OTA) measurement inside the anechoic or RF-shielded chamber 14 can be performed without the necessity of a feed switch or an antenna positioner.

Since the feed antennas 30 are connected at the same common side surface 32, it is ensured that the feed antennas 30 are located substantially at the focal point of the respective reflector(s) 24. This means that the deviation from the focal point is minimized due to the respective shape of the orthomode transducer assembly 16 that will be discussed hereinafter in more detail when referring to FIGS. 2 to 4, as the respective design of the orthomode transducer assembly 16 becomes clear from FIGS. 2 to 4.

In FIG. 2, the orthomode transducer assembly 16 is shown in an isometric view. As shown in FIG. 2, the orthomode transducer assembly 16 has several separately formed orthomode transducer components 34 that are stacked together linearly, thereby providing a sandwich of orthomode transducer components 34.

Figure 3:
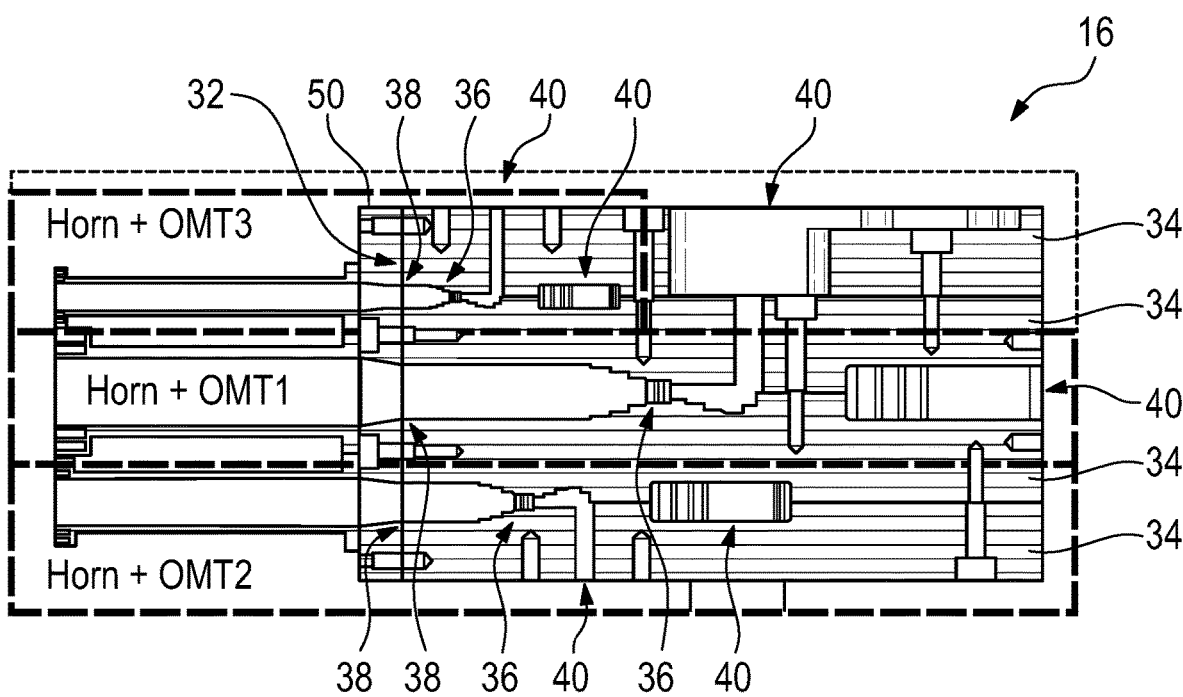
FIG. 3 shows a sectional view of the orthomode transducer assembly of FIG. 2.

In the shown embodiment, four orthomode transducer components 34 are shown that together form three different orthomode transducers 36 as shown in FIG. 3 illustrating a sectional view of the orthomode transducer assembly 16. In addition, FIG. 3 shows that each of the orthomode transducers 36 are connected to one output interface 38 located at the common side surface 32 of the orthomode transducer assembly 16, wherein the common side surface 32 is planar. Hence, the output interfaces 38 and/or the feed antennas 30 connected thereto are located in a common plane.

Furthermore, each of the orthomode transducers 36 is assigned to two input interfaces 40 via which differently polarized signals are forwarded to the dedicated orthomode transducer 36. Accordingly, the orthomode transducer assembly 16 shown has six input interfaces 40 in total, as three different orthomode transducers 36 are provided.

Figure 4:
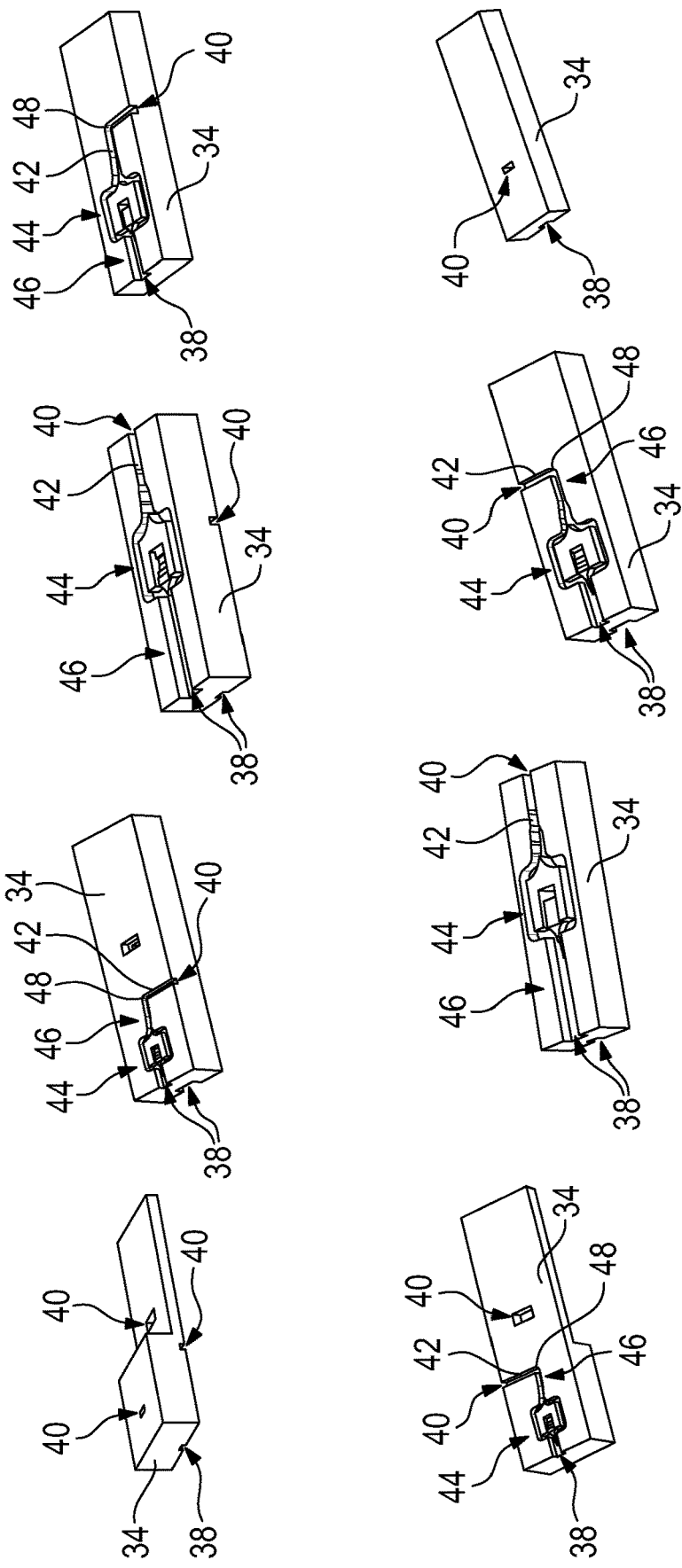
FIG. 4 shows an overview of several different orthomode transducer components, wherein each of the different orthomode transducer components is illustrated from opposite sides.

In FIGS. 3 and 4, it is further shown that the respective input interfaces 40 each merge into a corresponding waveguide transition 42. The respective waveguide transitions 42 each end up in the corresponding orthomode transducer 36.

However, the waveguide transitions 42 may be straight waveguide transitions or rather angled waveguide transitions, which depends on the respective orthomode transducer 36, for example its relative position in the stack of orthomode transducer components 34. This will be described in more detail below.

FIG. 4 further shows that the respective orthomode transducers 36 are formed by structured sections 44 provided at respective contact sides 46 via which neighbored orthomode transducer components 34 contact each other in the assembled state that is shown in FIGS. 2 and 3.

In other words, the orthomode transducer components 34 located in the center or rather sandwiched between the outer orthomode transducer components 34 each have two contact sides 46. Hence, the center or rather sandwiched orthomode transducer components 34 partially form two different orthomode transducers 36 simultaneously with their adjacent orthomode transducer components 46.

The orthomode transducer assembly 16 according to the embodiment shown has four orthomode transducer components 34 such that an upper orthomode transducer component 34 is provided that is shown on the left side in FIG. 4 as well as a lower orthomode transducer component 34 is provided that is shown on the right side in FIG. 4. The respective orthomode transducer components 34 each are shown from two opposite sides.

In addition, two center or middle orthomode transducer components 34 are provided that are directly contacted at opposite sides by two different orthomode transducer components 34 in the assembled state.

FIG. 4 shows that the center or middle orthomode transducer components 34 each have structured sections 44 at both opposite sides, as these orthomode transducer components 34 interact with their neighbored orthomode transducer components 34.

In some embodiments, both center or middle orthomode transducer components 34 together form a first orthomode transducer 36 that is labeled as OMT1 as shown in FIG. 3.

The first orthomode transducer 36 ("OMT1") is assigned to a frequency range from 24 GHz to 42 GHz.

As shown in FIGS. 3 and 4, the first orthomode transducer 36 ("OMT1") is connected with two straight waveguide transitions 42 that are orientated perpendicular with respect to each other. One of the two straight waveguide transitions 42 extends towards first orthomode transducer 36 ("OMT1") from a side being opposite to the common side surface 32 at which the output interfaces 38 are provided. The other one of the two straight waveguide transitions 42 is arranged perpendicularly thereto.

Further, both middle or center orthomode transducer components 34 interact with the upper orthomode transducer component 34 or rather the lower orthomode transducer component 34 respectively in order to establish the second orthomode transducer 36 ("OMT2") associated with a frequency range from 35 GHz to 60 GHz and a third orthomode transducer 36 ("OMT3") that is assigned to a frequency range from 60 GHz to 90 GHz.

As shown in FIGS. 3 and 4, the second orthomode transducer 36 ("OMT2") as well as the third orthomode transducer 36 ("OMT3") are connected with a straight waveguide transition 42 and an angled waveguide transition 42 respectively, wherein the angled waveguide transitions 42 each have a section 48 with an angle of ninety degree (90°). The angled waveguide transitions 42 each end at a common side 50 that is perpendicular to the common side surface 32 at which the output interfaces 38 are provided.

Besides the orthomode transducers 36 established by two adjacent orthomode transducer components 34 contacting each other via their contact sides 44, the respective input interfaces 40 may also be established by two adjacent orthomode transducer components 34 together, e.g., the ones merging into angled waveguide transitions 42. However, one straight waveguide transition 42 ending up in the first orthomode transducer 36 ("OMT1") is also established by two adjacent orthomode transducer components 34, namely the one extending from the side that is opposite to the common side surface 32 of the orthomode transducer assembly 16.

In general, the orthomode transducer assembly 16 comprises 2×N−(N−1) separately formed orthomode transducer components 34, wherein N corresponds to the number of orthomode transducers 36.

In the shown embodiment, the orthomode transducer assembly 16 has four separately formed orthomode transducer components 34 wherein three orthomode transducers 36 are established by these orthomode transducer components 34. Hence, N equals 3 (N=3) such that 2×3−(3−1)=4 separately formed orthomode transducer components 34 are provided as shown.

FIG. 2 further shows that an optional end cap 52 is provided, which is connected to the common side surface 32 of the orthomode transducer assembly 16, wherein the end cap 52 provides an adapter for the respective feed antennas 30 (not shown in FIG. 2) to be connected to the output interfaces 38. The end cap 52 has, for example, a plate-like base 54 and waveguides 56, wherein the end cap 52 is fixedly connected to the common outer side surface 32 via the plate-like base 54. The waveguides 56 are used for connecting the feed antennas 30 accordingly.

Due to the design of the orthomode transducer assembly 16, it is ensured that an antenna phase center separation between the feed antennas 30 to be connected to the orthomode transduce assembly 16 is below 2 centimeters, for example below 1.8 centimeters. Hence, it is not necessary to move the feed antennas 30 and/or the device under test 12 during the respective broadband testing, thereby reducing the overall costs significantly.

In the assembled state, the separately formed orthomode transducer components 34 are mechanically connected with each other by fastener elements, for instance by screws or the like. In addition, the end cap 52 may also be connected by fastener elements like screws.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also, in this regard, the present application may use the term "plurality" to reference a quantity or number. In this regard, the term "plurality" is meant to be any number that is more than one, for example, two, three, four, five, etc. The term "about," "approximately," etc., means plus or minus 5% of the stated value.

For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure, which are intended to be protected, are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure as claimed.

The embodiments of the invention in which an exclusive property or privilege is claimed are defined as follows:

1. An over-the-air measurement system for testing a device under test, wherein the over-the-air measurement system comprises an orthomode transducer (OMT) assembly having several separately formed orthomode transducer components that form at least two orthomode transducers, wherein the orthomode transducer assembly has at least two output interfaces for feed antennas, wherein each of the at least two output interfaces is connected with one dedicated orthomode transducer, wherein two input interfaces are associated with each of the orthomode transducers, wherein each of the input interfaces merge into a corresponding waveguide transition that ends up in the respective orthomode transducer that is associated with the corresponding input interface, and wherein the several orthomode transducer components are stacked together linearly,
wherein neighbored orthomode transducer components face each other via corresponding contact sides, and wherein the corresponding contact sides of the neighbored orthomode transducer components have structured sections that together form one of the at least two orthomode transducers, and/or
wherein the orthomode transducer assembly comprises 2×N−(N−1) separately formed orthomode transducer components, wherein N corresponds to the number of orthomode transducers.

2. The over-the-air measurement system according to claim 1, wherein the several orthomode transducer components are orientated with respect to each other such that two straight waveguide transitions are provided, which both end up in the same orthomode transducer.

3. The over-the-air measurement system according to claim 1, wherein the several orthomode transducer components are orientated with respect to each other such that one straight waveguide transition and an angled waveguide transition are provided, which both end up in the same orthomode transducer.

4. The over-the-air measurement system according to claim 3, wherein the angled waveguide transition comprises a section having a 90° angle.

5. The over-the-air measurement system according to claim 1, wherein at least two feed antennas are provided that are connected with the at least two output interfaces of the orthomode transducer assembly, respectively.

6. The over-the-air measurement system according to claim 1, wherein at least two waveguides are provided that are connected with the at least two input interfaces of the orthomode transducer assembly, respectively.

7. The over-the-air measurement system according to claim 1, wherein the over-the-air measurement system comprises at least one reflector.

8. The over-the-air measurement system according to claim 7, wherein the orthomode transducer assembly is orientated with respect to the at least one reflector such that at least two feed antennas connected with the orthomode transducer assembly are directed towards the at least one reflector.

9. The over-the-air measurement system according to claim 7, wherein at least two feed antennas are provided that are connected with the at least two output interfaces of the orthomode transducer assembly respectively, and wherein one of the at least two feed antennas is substantially located at the focal point of the at least one reflector.

10. The over-the-air measurement system according to claim 1, wherein the over-the-air measurement system comprises at least two reflectors, wherein a first reflector of the at least two reflectors is a main reflector established as a paraboloid reflector, and wherein a second reflector of the at least two reflectors is a sub-reflector established as a non-paraboloid reflector.

11. The over-the-air measurement system according to claim 1, wherein the over-the-air measurement system comprises an RF-shielded chamber that accommodates the orthomode transducer assembly.

12. The over-the-air measurement system according to claim 1, wherein the over-the-air measurement system comprises a measurement equipment that is connected with the orthomode transducer assembly.

13. The over-the-air measurement system according to claim 1, wherein the over-the-air measurement system comprises a positioner system for the device under test.

14. The over-the-air measurement system according to claim 1, wherein the orthomode transducer assembly comprises three orthomode transducers.

15. The over-the-air measurement system according to claim 14, wherein a first of the three orthomode transducers is assigned to a frequency range from 24 GHz up to 42 GHz, wherein a second of the three orthomode transducers is assigned to a frequency range from 35 GHz up to 60 GHz, and wherein a third of the three orthomode transducers is assigned to a frequency range from 60 GHz up to 90 GHz.

16. An over-the-air measurement system for testing a device under test, wherein the over-the-air measurement system comprises an orthomode transducer assembly having several separately formed orthomode transducer components that form at least two orthomode transducers, wherein the orthomode transducer assembly has at least two output interfaces for feed antennas, wherein each of the at least two output interfaces is connected with one dedicated orthomode transducer, wherein two input interfaces are associated with each of the orthomode transducers, wherein each of the input interfaces merge into a corresponding waveguide transition that ends up in the respective orthomode transducer that is associated with the corresponding input interface, wherein the at least two output interfaces are located at a common side surface of the orthomode transducer assembly, and wherein the common side surface is planar.

17. An over-the-air measurement system for testing a device under test, wherein the over-the-air measurement system comprises an orthomode transducer assembly having several separately formed orthomode transducer components that form at least two orthomode transducers, wherein the orthomode transducer assembly has at least two output interfaces for feed antennas, wherein each of the at least two output interfaces is connected with one dedicated orthomode transducer, wherein two input interfaces are associated with each of the orthomode transducers, wherein each of the input interfaces merge into a corresponding waveguide transition that ends up in the respective orthomode transducer that is associated with the corresponding input interface, and wherein the at least two output interfaces are arranged with respect to each other such that an antenna phase center separation is below 2 centimeters.

* * * * *